(12) United States Patent
Yamaguchi

(10) Patent No.: US 6,814,276 B2
(45) Date of Patent: Nov. 9, 2004

(54) PROCESS FOR SOLDERING AND CONNECTING STRUCTURE

(75) Inventor: Atsushi Yamaguchi, Minoo (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 10/327,143

(22) Filed: Dec. 24, 2002

(65) Prior Publication Data

US 2003/0121954 A1 Jul. 3, 2003

(30) Foreign Application Priority Data

Dec. 28, 2001 (JP) ........................... 2001-400696

(51) Int. Cl.⁷ ................ B23K 1/20; B23K 31/02; H01R 12/04
(52) U.S. Cl. .............. 228/208; 228/209; 228/262.1; 228/262.61; 174/256; 174/260
(58) Field of Search ............................. 228/208, 209, 228/180.22, 262.1, 262.61; 174/256, 260; 438/612–614

(56) References Cited

U.S. PATENT DOCUMENTS

| | | | | |
|---|---|---|---|---|
| 5,452,842 A | * | 9/1995 | Melton et al. | 228/180.22 |
| 5,821,627 A | * | 10/1998 | Mori et al. | 257/780 |
| 5,981,085 A | * | 11/1999 | Ninomiya et al. | 428/614 |
| 6,082,610 A | * | 7/2000 | Shangguan et al. | 228/180.22 |
| 6,486,411 B2 | * | 11/2002 | Miura et al. | 174/256 |
| 6,613,599 B2 | * | 9/2003 | Imaeda | 438/30 |
| 2001/0029095 A1 | * | 10/2001 | Tadauchi et al. | 438/612 |
| 2002/0179328 A1 | * | 12/2002 | Sakai et al. | 174/260 |
| 2002/0191378 A1 | * | 12/2002 | Suzuki et al. | 361/704 |
| 2003/0089923 A1 | * | 5/2003 | Oida et al. | 257/200 |

FOREIGN PATENT DOCUMENTS

| | | |
|---|---|---|
| EP | 1 272 018 | 1/2000 |
| JP | 2001-237272 | 8/2001 |
| JP | 2001-284785 | 10/2001 |
| JP | 2002-185131 | 6/2002 |

* cited by examiner

Primary Examiner—L. Edmondson
(74) Attorney, Agent, or Firm—Wenderoth, Lind & Ponack L.L.P.

(57) ABSTRACT

A barrier metal layer is provided on at least one electrodes, wherein one electrode is formed on a substrate and another is connected to an electronic component, so as to coat a base material of the electrode. The base material is made of a material containing Cu. Soldering between the electrode of the electronic component and the electrode on the substrate is conducted by supplying a solder material containing Sn and Zn, placing the solder material in contact with the barrier metal layer while the solder material is in a molten state, and solidifying the solder material. Thus, in the case where the electronic component is soldered to the substrate with the solder material such as an Sn—Zn-based material, the degradation of a soldering part is avoided, Consequently, a sufficient thermal fatigue strength of the soldering part is obtained.

19 Claims, 2 Drawing Sheets

PROCESS FOR SOLDERING AND CONNECTING STRUCTURE

CROSS-REFERENCE TO RELATED APPLICATIONS

The present application claims a priority under 35 U.S.C. §119 to Japanese Patent Application No. 2001-400696 filed on Dec. 28, 2001, entitled "PROCESS FOR SOLDERING AND CONNECTING STRUCTURE". The contents of that application are incorporated herein by the reference thereto in their entirety.

BACKGROUND OF THE INVENTION

1. Field of the Invention

The present invention relates to a process for soldering a member to another member. More specifically, the present invention relates to a process for soldering a land formed on a substrate to an electrode (e.g. a lead) of an electronic component in the production of an electronic circuit board. Furthermore, the present invention also relates to a connecting structure, more specifically an electronic circuit board, produced by such process for soldering.

2. Description of Related Art

In the production of an electronic circuit board to be used for an electronic device and so on, a reflow soldering process is known as a process for mounting an electronic component on a substrate, more specifically, for physically connecting a lead taken out from the electronic component, to a land formed on the substrate.

In a general reflow soldering process, a so-called cream solder is applied by screen printing onto a land that is a part of a patterned wiring formed on a substrate. The cream solder is usually a mixture of soldering powder of a solder material, and a flux including rosin, an activator and a solvent. After that, an electronic component is located on a predetermined portion of the substrate so that a lead taken out from the electronic component adheres to the cream solder applied on the land. Thus obtained substrate, on which the electronic component is located through the cream solder, is heated at a temperature of at least the melting point of the used solder material so as to activate the flux and melt solder material of the soldering powder in the cream solder, and to evaporate (or volatilize) off other components such as the flux in the cream solder. Thereafter, the resultant product is cooled (or subjected to radiational cooling) such that the molten solder material is solidified. The solidified solder material forms a connecting part between the lead of the electronic component and the land of the substrate to electrically and physically connect them each other. Although other component(s) such as the flux other than the solder material may be present in the connecting part, such other component is excluded by phase separation form the solder material during the heating. Therefore such component is not present inside the connecting part and only remains in a small amount on the surface of the connecting part. Thereby, an electronic circuit board is obtained, wherein the electronic component is mounted on the substrate by the connecting part (or the soldering part) which is substantially composed of the solder material.

As the solder material, an Sn—Pb based material, in particular an Sn—Pb based material having an eutectic composition (hereinafter simply referred to as an Sn—Pb eutectic material also) is generally used. The eutectic composition of the Sn—Pb based material is an Sn-37Pb composition (i.e. a composition consisting of 37% by weight of Pb and the rest (63% by weight) of Sn). It is known that the Sn—Pb based material has a melting point of 183° C. in the case of this eutectic composition.

Recently, a manner of disposing an electronic device including the electronic circuit board described above becomes an issue, and this causes a concern about influence on the global environment or human bodies due to lead (Pb) contained in the conventional solder material. For that reason, there is a movement for using a solder material containing no lead, namely a lead-free solder material, in place of the conventionally used Sn—Pb based material, and efforts has been made to put the lead-free solder material into practical use.

At present, materials having various compositions have been suggested as the lead-free solder material. One of them is an Sn—Zn based material. As a result of recent studies, the eutectic composition of the Sn—Zn based material is roughly an Sn-9Zn composition (i.e. a composition consisting of 9% by weight of Zn and the rest (91% by weight) of Sn). It has turned out that the Sn—Zn based material has a melting point of 199° C. in the case of this eutectic composition.

Considering the thermal resistance of the electronic component to be mounted on the substrate as well as the adaptability for the existing soldering process, the lead-free solder material desirably has a melting point that is sufficiently low so as not to damage the electronic component, and is close to the melting point of the conventional Sn—Pb based material. The melting point of the Sn—Zn based material as above is lower than the melting point of other lead-free solder material such as an Sn—Ag based material, and is relatively close to the melting point of the Sn—Pb based material. Accordingly, the Sn—Zn based material can be regarded as a strong candidate for a substitute for the Sn—Pb based material.

By using the Sn—Zn based material in place of the Sn—Pb based material, there is an advantage in that soldering of an electronic component to a circuit board can be conducted while avoiding thermal damage to the electronic component. However, from a result of a test for continuous use of the electronic circuit board obtained thereby under a high temperature condition, the inventors found that a connecting part between the land of the substrate and the lead of the electronic component degraded and a sufficiently high thermal fatigue strength could not be obtained.

It is considered that such degradation (or deterioration) results from following mechanism. Zinc (Zn) contained in the Sn—Zn based material is contacted with copper (Cu) used for a material of the land and the lead. Then, an intermetallic compound of Cu—Zn is formed at (or in the vicinity of) interfaces between the connecting part and the land and between the connecting part and the lead.

More detail explanation hereinafter will be made with reference to FIG. 2, as to an electronic circuit board 80 which is produced by soldering an electronic component to a substrate while using a cream solder containing soldering powder of the Sn—Zn based material in place of the Sn—Pb material in the conventional reflow soldering process as described above.

In this electronic circuit board 80, a lead 69 taken out from an electronic component 67 is electrically and mechanically connected to a land 63 formed on a substrate 61 through a connecting part 65. The land 63 is generally made of Cu and is formed integrally with a patterned wiring. The lead 69 is generally composed of a base material 69a of Cu and a plating 69b of an Sn—Pb eutectic material which coats the base material 69a. The connecting part 65 results from the cream solder by a heat treatment, and it is substantially made of a solder material derived from the soldering powder as mentioned above.

At present, the movement away form lead (Pb) has also been advanced as to a plating material of a lead of an electronic component. In the current situation during a transitional period, however, there is a case where the Sn—Pb based material is still used.

During the heat treatment, Cu consisting in the land 63 diffuses into the solder material to be combined with Zn since the solder material is directly contacted with the land 63. As a result, an intermetallic compound 73 of Cu—Zn is formed at (or in the vicinity of) an interface of the contact between the connecting part 65 and the land 63.

Further, during the heat treatment, the solder material of the soldering powder melts, and the plating 69b of the Sn—Pb eutectic material also melt since the melting point of the Sn—Pb eutectic material is generally lower than the temperature of the heat treatment. A part of the plating 69b which part is contacted with the molten solder material, melts and diffuses into the solder material. For this reason, the plating 69b of the lead 69 is partially removed off, so that the base material 69a comes to be in direct contact with the molten solder material. Therefore, Cu consisting in the base material 69a of the lead 69 diffuses into the solder material to be combined with Zn similarly to the above. An intermetallic compound 71 of Cu—Zn is formed at an interface of the contact between the connecting part 65 and the lead 69.

Locating the substrate, to which the electronic component is soldered as described above, under a high temperature condition for a long time, a more amount of Cu diffuses into the connecting part (or the soldering part) to proceed the formation of the intermetallic compounds 71 and 73 of Cu—Zn. The total amount of Cu contained in the solder material is exhausted for the formation of intermetallic compound of Cu—Zn in due course. Next, Cu remaining without contributing the formation of the intermetallic compound and/or Cu consisting the intermetallic compound of Cu—Zn diffuses into the solder material, and Sn in the solder material migrates by diffusion for voids resulting from the diffusion of Cu. In other words, interdifussion is brought about. It is considered that such phenomenon invites the degradation of the connecting part.

Additionally, an intermetallic compound of Sn—Cu may be formed at interfaces between the connecting part and the land and/or between the connecting part and the lead also in a conventional case as in the prior art where the cream solder containing soldering powder of the Sn—Pb based material is used, since copper (Cu) as a material of the land and/or the lead diffuses into the connecting part and combines with tin (Sn) contained in the Sn—Pb based material. However, since the intermetallic compound of Sn—Cu is stable, it can bear a continuous use under a high temperature condition. Therefore, even though the intermetallic compound of Sn—Cu is formed, it is considered that the problem of the degradation in the connecting part did not occur in such conventional case.

There is a case where the base material 69a of the lead 69 is not made of Cu, but made of other material such as an Fe-42Ni alloy material (i.e. an alloy material consisting of 42% by weight of Ni and the rest (58% by weight) of Fe). In this case, even if the plating 69b of the lead 69 melts and diffuses into the solder material to contact with the base material 69a directly, the intermetallic compound 71 of Cu—Zn is not formed at the interface of the lead 69 and the connecting part 65. On the other hand, the intermetallic compound 73 of Cu—Zn is again formed at the interface of the land 63 of Cu and the connecting part 65 Thus, when the resultant electronic circuit board is subjected to a test for continuous use under a high temperature condition, the degradation of the connecting part occurs. It is not possible also in this case to avoid the problem of an insufficient thermal fatigue strength.

As described above, the cases of using the Sn—Zn based material were explained, and similar problems may also occur on using other solder materials at least containing Sn and Zn.

SUMMARY OF THE INVENTION

The present invention aims to provide a soldering process which can effectively prevent the degradation of a soldering part (or a connecting part) after a continuous use under a high temperature condition so as to attain a sufficiently high thermal fatigue strength. Such degradation is caused through the mechanism which is peculiar to the cases where an electronic component is soldered (or connected) to a circuit board using a solder material containing Sn and Zn such as an Sn—Zn based material. The present invention also aims to provide an electric circuit board produced by such soldering process.

The inventors approach the problems described above to prevent the formation of the intermetallic compound of Cu—Zn.

According to one aspect of the present invention, in the process for soldering a first member to a second member with the solder material containing Sn and Zn, at least one of the first and second members includes a base material containing Cu and provided with a barrier metal layer for coating the base material, and the solder material in a molten state is contacted with the barrier metal layer and is solidified, whereby the first member is soldered (or connected) to the second member.

According to the soldering process as above, Sn in the solder material is not directly contacted with Cu contained in the base material due to the barrier metal layer, whereby the formation of the intermetallic compound of Cu—Zn can effectively be suppressed or prevented. Therefore, causes for the degradation of the connecting part after a continuous use under a high temperature condition, and furthermore for the degradation of the thermal fatigue strength can be reduced or eliminated.

Furthermore, according to the present invention, there is provided a connecting structure formed by soldering the first member to the second member with the solder material containing Sn and Zn, wherein at least one of the first and second members includes the base material containing Cu and the barrier metal layer for coating the base material. The connecting structure can attain the similar effects as above.

Hereinafter, the present invention will be described in more detail.

According to one aspect of the present invention, there is provided a process for soldering (or connecting) a first member to a second member with a solder material containing Sn and Zn, such as an Sn—Zn based material, which process comprises: supplying (or placing) the solder material between the first and second members, wherein at least one of the first and second members has a base material (or a parent material) containing Cu and a barrier metal layer for coating the base material; contacting the solder material in a molten state with the barrier metal layer; and solidifying the molten solder material, whereby the first member is soldered to the second member.

According to the soldering process as above, the base material containing Cu is coated with the barrier metal layer, and the solder material containing Sn and Zn is contacted with the barrier metal layer. Thus, a direct contact of Zn in the solder material with Cu contained in the base material can be avoided, so that the formation of an intermetallic compound of Cu—Zn can be suppressed or prevented effectively. As a result, it is possible to reduce or eliminate the degradation of the soldering part (also referred to as the connecting part in the present specification) and thus the decrease in a thermal fatigue strength, after a continuous use under a high temperature condition.

According to another aspect of the present invention, there is also provided a method for improving a thermal fatigue strength of a soldering part formed by a process which comprises: supplying (or placing) a solder material comprising Sn and Zn between a first member and a second member, at least one of the first and second members having a portion comprising Cu; contacting the solder material in a molten state with the first and second members; and solidifying the molten solder material to form a soldering part of the solder material between the first and second members, wherein the method comprises providing a barrier metal layer for coating that portion as a base material, and contacting the solder material in a molten state with the barrier metal layer, whereby the thermal fatigue strength of the soldering part is improved.

In a case where both of the first and second members are made of the material containing Cu, and therefore Cu can diffuse into the solder material (or the connecting part) from both members, the material containing Cu is preferably coated with the barrier metal layer in both of these members so that the material containing Cu is not directly contacted with the solder material. Thereby, the formation of the intermetallic compound of Cu—Zn can be prevented. However, the present invention is not necessarily limited to this. Even in such case as above, the decrease in the thermal fatigue resistance can be alleviated by providing any one of the first and second members with the barrier metal layer, in comparison with a case where no barrier metal layer is provided.

In the present invention, it is necessary that the barrier metal layer coats the base material such that the base material containing Cu does not substantially contacts with the solder material in a molten state, although the barrier metal layer may be composed of either of a single layer or a multilayer laminate. A material for the barrier metal layer preferably does not substantially diffuse (or dissolve) into the molten solder material, or diffuses into it at a little amount enough to avoid substantially contacting the base material which contains Cu and located under the base material, with the solder material by exposing the base material to the solder material. In the present specification, an exposed surface side to be contacted with the solder material is set "above" with reference to the base material of the member to be soldered, while a base material side is set "under" on the same reference.

Further, the barrier metal layer is preferably composed of a conductive material so as to secure an electrical conduction between the first member and the second member. For example, the barrier metal layer can be a metallic layer or a multilayer laminate thereof.

In a preferred embodiment of the present invention, the barrier metal layer can be an Ni layer (i.e. a layer made of Ni, other layers mentioned below will be expressed in the same manner) or a multilayer laminate including an Ni layer. It is suitable to use Ni as a material for the barrier metal layer, since Ni hardly diffuses into the solder material while it is contacted with the solder material, and thus does not expose the base material located under the Ni layer as the barrier metal layer (thus, Cu contained in the base material does not elute into the solder material). The Ni layer is preferably directly contacted with the base material containing Cu so as to coat the base material. However, the present invention is not limited to this, and a layer composed of other conductive material may be provided between the Ni layer and the base material.

In a case where a multilayer laminate including an Ni layer is used as the barrier metal layer, at least one layer selected from the group consisting of an Au layer, a Pd layer, Sn—Pb layer (i.e. a layer made of an Sn—Pb based material, other layers mentioned below will be expressed in the same manner) and an Sn—Bi layer can be provided above the Ni layer. The Ni layer is readily oxidized in air. Due to its oxide, a wettability of the Ni layer to the solder material is comparatively poor. On the other hand, the layers described above such as the Au layer, are hardly oxidized compared with the Ni layer, and they thus have a good wettability to the solder material. For example, the barrier metal layer can consist of an Ni/Au layers, an Ni/Pd layers, an Ni/Pd/Au layers, an Ni/Sn—Pb layers, an Ni/Sn—Bi layers or the like. By providing such layer to form the surface of the barrier metal layer above the Ni layer, the wettability to the solder material can be improved, and thus a connection reliability at the connecting part (mainly a connection strength) can be improved compared with a case where the Ni layer is used alone. In particular, the surface (or the top layer) of the barrier metal layer is preferably formed by an Au layer.

The layer constituting the barrier metal layer (if the barrier metal layer is in the form of a multilayer laminate, at least one layer thereof) can be formed by, for example, an electroplating method, a hot-dip plating method, a displacement plating method, or a deposition method, which are known in the art.

According to another aspect of the present invention, there is provided a connecting structure formed by soldering the first member to the second member with the solder material containing Sn and Zn, wherein at least one of the first member and the second member includes the base material containing Cu and the barrier metal layer for coating the base material.

In such connecting structure, since the base material containing Cu is coated with the barrier metal layer, the formation of an intermetallic compound of Cu—Zn can be suppressed or prevented effectively in the same manner as in the soldering process of the present invention as mentioned above. Thereby, it is possible to avoid causing the degradation of the connecting part, and thus to maintain a high thermal fatigue strength, after the connecting structure of the present invention is subjected to a continuous use under a high temperature condition.

Such connecting structure can be obtained by the soldering process of the present invention as mentioned above. Further, also in the connecting structure of the present invention, a barrier metal layer as mentioned above with regard to the soldering process of the present invention can be used. In a case where the barrier metal layer is composed of the Ni layer alone, the Ni layer remains as the barrier metal layer in the connecting structure obtained by the soldering process of the present invention. However, in a case where the barrier metal layer is composed of the Ni layer and, for example, the Au layer located above the Ni layer, Au in the Au layer elutes (or melts and diffuses) into the solder material by contacting the Au layer with the molten solder material, and therefore the Au layer is not recognized as one layer constituting the barrier metal layer. The Pd layer, the Sn—Pb layer and the Sn—Bi layer are the same as in the Au layer.

In the soldering process, the method for improving the thermal fatigue strength of the soldering part (or the connecting part) and the connecting structure of the present invention, at least one of the first member and the second member to be soldered includes a portion containing Cu, and the portion as the base material is coated with the barrier metal layer. For example, in a case where one of the first member and the second member has the portion containing Cu, and the other has no portion containing Cu, said one portion containing Cu is coated (as a base material) with the barrier metal layer. For example, in a case where both of the first member and the second member have a portion containing Cu, at least one of said portions, preferably both the portions are coated (as base materials) with the barrier metal layer.

In the present invention, a set of the first and the second members can be a combination of a substrate and an electronic component, more specifically a combination of an electrode formed on a substrate and an electrode of an electronic component.

The above substrate includes, for example, those of a paper phenol material, a glass epoxy material, a polyimide film material, a ceramic material, a metallic material or the like. The electrode to be formed on such substrate can be, for example, a land formed integrally with a patterned wiring. This electrode can be formed by coating the base material of, for example, Cu with the barrier metal layer.

The electronic component as mentioned above includes, for example, a semiconductor component (such as a so-called QFP (quad flat package) component, a CSP (chip scale package) component, an SOP (single outside package) component), a chip component (such as a resistor, a capacitor, a transistor, and an inductor), a connector and the like. The electrode of such electronic component can be, for example, a lead or a terminal taken out from (or connected to) an electronic component. This electrode can be formed by coating the base material of, for example, Cu with the barrier metal layer.

However, the present invention is not limited to this. The first and second members can be various members which are to be soldered to each other. Thus, according to yet another aspect of the present invention, there is also provided the electrical component or an electronic component which is soldered with the solder material containing Sn and Zn, said electrical or electronic component having the electrode including the base material containing Cu and the barrier metal layer for coating the base material.

In the present specification, the solder material means a metal material having a relatively low melting point, e.g., a metal material which melts at a temperature in the range of about 100–250° C. The solder material containing Sn and Zn means a material containing at least Sn and Zn among such solder materials. For example, the solder material containing Sn and Zn can be an Sn—Zn based material (which can include an Sn—Zn eutectic material and an Sn—Zn—Bi material obtained by adding Bi to the Sn—Zn eutectic material). Further, the term "-based material" means a material based on the eutectic composition composed of designated metal elements and may containing a small amount of other metal element(s). The Sn—Zn based material, for example, is based on the Sn-9Zn eutectic composition and may or may not contain a small amount of other metallic element(s) (which is intentionally or unavoidably added thereto). The Sn—Zn based material can have a melting point of about 190–200° C., for example.

In the present invention, as readily understood by those skilled in the art, the soldering process can be conducted in a manner of either a reflow soldering process or a flow soldering process, on either or both sides of the substrate, and the connecting structure of the present invention is obtained by any one of these processes.

The concept of preventing the contact between Cu and Zn by the barrier metal layer in the present invention can be suitably adopted to a case where it is demanded to solve the possible problems associated with the formation of an intermetallic compound of Cu—Zn under a condition where Cu and Zn coexist in a system.

It is noted that the soldering process in the present invention can also be recognized as a process for producing the connecting structure in which the first member is soldered to the second member.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE INVENTION

Figure 1:
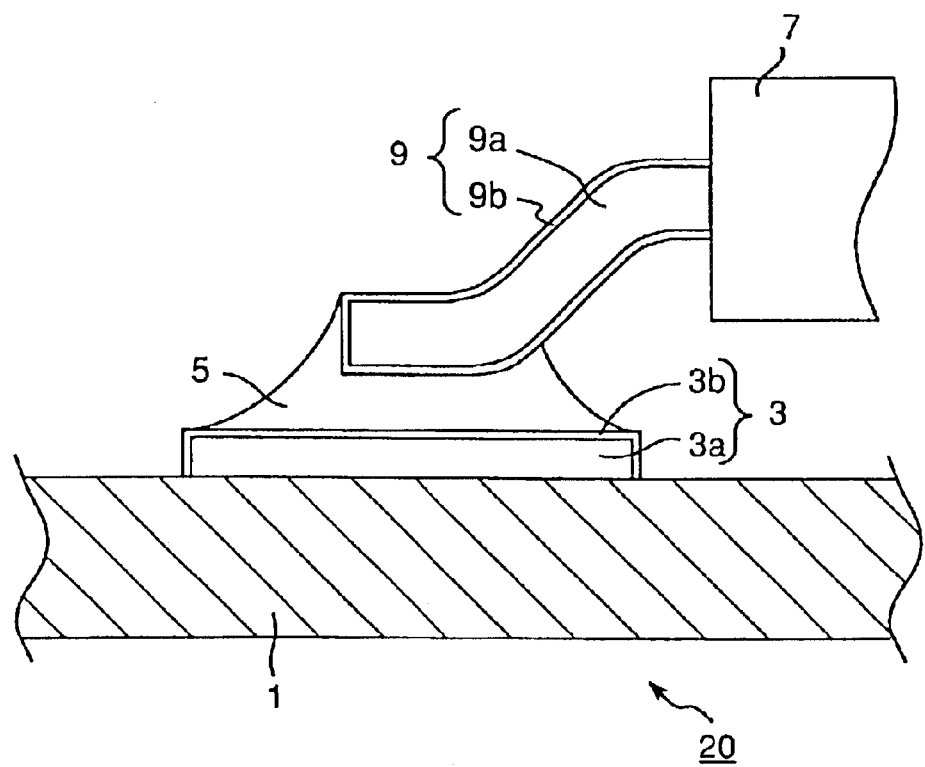
FIG. 1 shows a schematic partial cross section of an electronic circuit board produced by a soldering process in one embodiment of the present invention.
Figure 2:
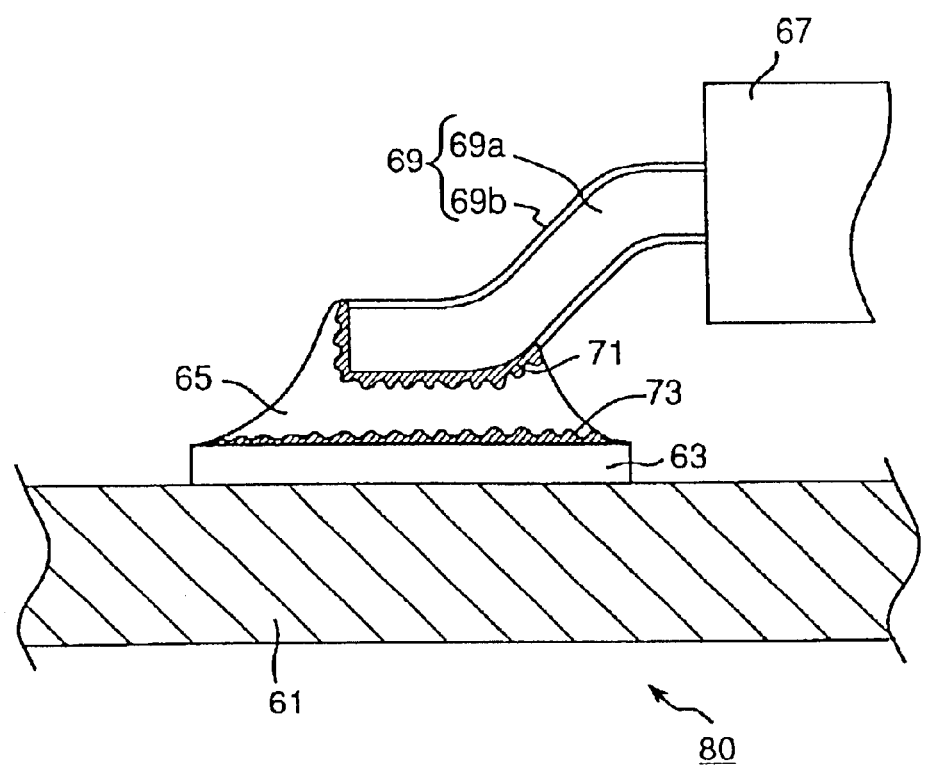
FIG. 2 shows a schematic partial cross section of an electronic circuit board produced by the conventional soldering process.

One embodiment of the present invention will hereinafter be described with reference to FIG. 1. FIG. 1 shows a schematic partial cross section of an electronic circuit board produced by a soldering process in the present embodiment.

First, a substrate 1 and an electronic component 7 to be connected to the substrate 1 are prepared. A land 3 is formed on the substrate 1. The land 3 includes a base material 3a made of Cu and a barrier metal layer 3b which consists of a single Ni layer and coats the base material 3a. The land 3 can be formed, for example, by the following procedure.

On an upper surface side of the substrate 1 made of, for example, glass epoxy resin, the base material 3a is formed integrally with a patterned wiring (not shown) by thermocompression bonding (or applying) of a copper foil followed by etching. The patterned wiring can have a width of about 50–100 μm, for example. After that, a resist is formed on a predetermined region of the surface side of the substrate 1 while covering the patterned wiring. At this stage, the base material 3a is not covered with the resist but is exposed. The height of the base material 3a (which is equal to the height of the patterned wiring) can be about 10–40 μm, for example.

The substrate 1 thus formed with the base material 3a, is immersed in an electrolytic solution to which Ni has been dissolved, and an appropriate voltage is applied to the base material 3a to precipitate Ni on the surface of the base material 3a. In this manner, an Ni layer as the barrier metal layer 3b is formed on the surface of the base material 3a by an electroplating method. The height of the Ni layer (which corresponds to the height of the barrier metal layer 3b in the present embodiment) can be, for example, about 2–5 μm. Thereby, it is possible to form the land 3 including the base material 3a and the barrier metal layer 3b (i.e. the Ni layer in the present embodiment) that coats the base material 3a, on the surface of the substrate 1. Seen from an upper surface side of the substrate 1, the land 3 can be in, for example, a rectangular shape having a lateral width of about 0.5–2 mm and a longitudinal width of about 0.5–2 mm. However, the present embodiment is not limited to this, and the land may be in any appropriate shape and size.

In the above description, the process for forming the Ni layer by the electroplating method was illustrated. In place of the above process, it is also possible to form an Ni layer coating the base material 3a: by a hot-dip plating method in which the substrate 1 formed with the base material 3a is dipped into a molten Ni material; by a displacement plating method in which such substrate 1 is dipped into a liquid containing a metal for plating and then the surface part of the base material 3a is displaced (or substituted) with the plating metal; or by a deposition method in which Ni is deposited onto the base material 3a. Those skilled in the art can conduct the electroplating method, the hot-dip plating method, the displacement plating method or the deposition method as described above while selecting appropriate conditions.

On the other hand, the electronic component 7 is provided with a lead 9. The lead 9 includes a base material 9a made of Cu and a barrier metal layer 9b which consists of a single Ni layer and coats the base material 9a. The lead 9 can be obtained beforehand by forming the Ni layer as the barrier metal layer on the surface of the base material 9a in the same manner as above. The electronic component 7 having this lead 9 is prepared.

A cream solder is applied on the land 3 of the substrate 1 thus prepared, for example, by a screen printing method, a dispensing method or the like. This cream solder consists of a flux and metal particles (or soldering powder) dispersed in the flux. The metal particles are made of a solder material containing Sn and Zn such as an Sn—Zn based material, more specifically an Sn—Zn eutectic material. As the flux, a commercially available flux including rosin, an activator and a solvent can be used. The metal particles can have an average diameter of, for example, about 20–40 μm, and can be present in the cream solder at a ratio of about 85–90% by weight on the basis of the total weight of the cream solder.

Thereafter, the electronic component 7 is appropriately placed on the substrate 1 so that the lead 9 of the electronic component 7 is contacted with the cream solder applied on the land 3. In this stage, the cream solder is contacted with the barrier metal layer 9b of the lead 9 and the barrier metal layer 3b of the land 3, and is not contacted with the base materials 9a and 3a. Thus resultant substrate 1 is subjected to a heat treatment by passing through a heated atmosphere at a temperature of for example, about 205–230° C., preferably about 210–220° C. As a result, an amount of heat is supplied to the cream solder to melt the solder material (the Sn—Zn based material in the present embodiment) of the metal particles in the cream solder, while components other than the metal particles, such as the flux, are evaporated (or volatilized) to be removed.

During the heat treatment, since Ni constituting the barrier metal layers 3b and 9b hardly melt and diffuses in the molten solder material although the molten solder material is contacted with the barrier metal layers 3b and 9b, the molten solder material is not directly contacted with the base materials 3a and 9a. Therefore, the formation of an intermetallic compound of Cu—Zn is prevented.

Then, following to the heat treatment, the substrate 1 is cooled (or subjected to radiational cooling) to solidify the molten solder material, whereby a connecting part (a soldering part) 5 substantially made of the solder material is formed. By this connecting part 5, the lead 9 of the electronic component 7 is electrically and mechanically connected (soldered) to the land 3 of the substrate 1.

As described above, there is produced an electronic circuit board 20 wherein the electronic component 7 is mounted on the substrate 1. As to both of an interface (or a connection interface) between the lead 9 of the electronic component 7 and the connecting part 5, and an interface (or a connection interface) between the land 3 of the substrate 1 and the connecting part 5 in the produced electronic circuit board 20, the formation of the intermetallic compound of Cu—Zn is prevented.

Although the barrier metal layer is in the form of the single Ni layer in the present embodiment, the present invention is not limited to this. A barrier metal layer in the form of a multilayer laminate may be provided while forming other layer(s) such as an Au layer, above the Ni layer in such a manner as the formation of the Ni layer. Said other layer(s) such as the Au layer locating above the Ni layer is formed with a thickness of about 0.01–0.1 μm per layer.

Although both the base materials of the land and the lead are made of Cu and are coated with the barrier metal layer in the present embodiment, the present invention is not limited to this. At least one of the base materials can contain Cu, and the one base material containing Cu can be coated with the barrier metal layer. For example, in the case where the base material of the lead is made of an Fe-42Ni alloy material containing no Cu, this base material is not necessarily coated with the barrier metal layer. The base material in such case may be coated with a plating made of, for example, an Sn—Pb based material.

Furthermore, in the present embodiment, the electronic component is soldered (or connected) to the substrate by the reflow soldering process, but the present invention is not limited to this. A substrate and an electronic component prepared in the same manner as in the present embodiment may be soldered each other by, for example, a flow soldering process.

What is claimed is:

1. A method of soldering comprising:
   supplying a solder material including Sn and Zn between a first member and a second member, at least one of the first member and the second member comprises a base material including Cu and a barrier metal layer coating the base material, the barrier metal layer including an Ni layer and at least one of an Sn—Pb outer layer and an Sn—Bi outer layer located over the Ni layer;
   placing the solder material in contact with the barrier metal layer while the solder material is in a molten state; and
   solidifying the solder material so as to solder the first member to the second member.

2. The method of claim 1, wherein at least one layer of the barrier metal layer is formed by a method selected from the group consisting of an electroplating method, a hot-dip plating method, a displacement plating method and a deposition method.

3. The method of claim 1, wherein the first member is an electrode formed on a substrate, and the second member is a lead electrode of an electronic component.

4. The method of claim 1, wherein said placing of the solder material in contact with the barrier metal layer while the solder material is in a molten state comprises using a flow soldering process.

5. The method of claim 1, wherein both the first member and the second member comprise the barrier metal layer coating the base material.

6. The method of claim 1, wherein either the Sn—Pb outer layer or the Sn—Bi outer layer of the at least one of an Sn—Pb outer layer and an Sn—Bi outer layer of the barrier metal layer is an outer surface layer of the barrier metal layer for contacting the molten solder material.

7. A connecting structure formed by soldering a first member to a second member with a solder material including Sn and Zn, wherein at least one of said first member and said second member comprises, before soldering, a base material including Cu and a barrier metal layer coating said base material, said barrier metal layer including an Ni layer and at least one of an Sn—Pb outer layer and an Sn—Bi outer layer located over the Ni layer.

8. The connecting structure of claim 7, wherein said first member is an electrode formed on a substrate, and said second member is a lead electrode of an electronic component.

9. The connecting structure of claim 7, wherein both said first member and said second member comprise, before soldering, said barrier metal layer coating said base material.

10. The connecting structure of claim 7, wherein either said Sn—Pb outer layer or said Sn—Bi outer layer of said at least one of an Sn—Pb outer layer and an Sn—Bi outer layer of said barrier metal layer is an outer surface layer of said barrier metal layer for contacting the solder material.

11. A component to be soldered with a solder material including Sn and Zn, comprising:

an electrode comprising a base material including Cu and a barrier metal layer coating said base material, said barrier metal layer including an Ni layer and at least one of an Sn—Pb outer layer and an Sn—Bi outer layer located over the Ni layer.

12. The component of claim 11, wherein either said Sn—Pb outer layer or said Sn—Bi outer layer of said at least one of an Sn—Pb outer layer and an Sn—Bi outer layer of said barrier metal layer is an outer surface layer of said barrier metal layer for contacting said solder material.

13. The component of claim 11, wherein said component comprises one of an electric component and an electronic component.

14. A method of soldering comprising:

supplying a solder material including Sn and Zn between a lead electrode of an electronic component and an electrode on a substrate, each of the electrodes comprising a base material including Cu and a barrier metal layer coating the base material, the barrier metal layer including an Ni layer and at least one of an Sn—Pb outer layer and an Sn—Bi outer layer located over the Ni layer;

placing the solder material in contact with the barrier metal layer of each of the electrodes while the solder material is in a molten state; and solidifying the solder material so as to solder the electrodes.

15. The method of claim 14, wherein at least one layer of the barrier metal layer of each of the electrodes is formed by a method selected from the group consisting of an electroplating method, a hot-dip plating method, a displacement plating method and a deposition method.

16. The method of claim 14, wherein said placing of the solder material in contact with the barrier metal layer of each of the electrodes while the solder material is in a molten state comprises using a flow soldering process.

17. The method of claim 14, wherein either the Sn—Pb outer layer or the Sn—Bi outer layer of the at least one of an Sn—Pb outer layer and an Sn—Bi outer layer of the barrier metal layer of each of the electrodes is an outer surface layer of the barrier metal layer of each of the electrodes for contacting the molten solder material.

18. A method of soldering comprising:

supplying a solder material including Sn and Zn between a lead electrode of an electronic component and an electrode on a substrate, each of the electrodes comprising a base material including Cu and a barrier metal layer coating the base material;

placing the solder material in contact with the barrier metal layer of each of the electrodes while the solder material is in a molten state; and solidifying the solder material so as to solder the electrodes.

19. The method of claim 18, wherein the lead electrode of the electronic component comprises a wire lead electrode, and the electrode on the substrate comprises a planar electrode.

* * * * *